(12) United States Patent
Barabash et al.

(10) Patent No.: US 7,362,182 B2
(45) Date of Patent: Apr. 22, 2008

(54) POWER AMPLIFIER

(75) Inventors: Leonid S. Barabash, Poway, CA (US); Christopher W. Crowley, San Diego, CA (US); Peter J. Turner, San Diego, CA (US)

(73) Assignee: GE Security, Inc., Austin, TX (US)

( * ) Notice: Subject to any disclaimer, the term of this patent is extended or adjusted under 35 U.S.C. 154(b) by 237 days.

(21) Appl. No.: 11/216,923

(22) Filed: Aug. 31, 2005

(65) Prior Publication Data

US 2007/0046371 A1   Mar. 1, 2007

(51) Int. Cl.
 *H03F 3/04* (2006.01)
 *H01F 27/28* (2006.01)
(52) U.S. Cl. ...................................... 330/301; 336/170
(58) Field of Classification Search ................. 330/301
 See application file for complete search history.

(56) References Cited

U.S. PATENT DOCUMENTS

| | | | | |
|---|---|---|---|---|
| 3,317,849 | A | * 5/1967 | Smith-Vaniz | ............... 330/286 |
| 3,939,380 | A | 2/1976 | Peer | |
| 4,652,986 | A | * 3/1987 | Kolkman | ................. 363/56.01 |
| 4,733,194 | A | 3/1988 | Roehrs et al. | |
| 4,864,478 | A | * 9/1989 | Bloom | ....................... 363/16 |
| 4,899,116 | A | 2/1990 | Roehrs et al. | |
| 4,994,760 | A | 2/1991 | Roehr | |
| 5,138,545 | A | * 8/1992 | Godawski | .................... 363/68 |
| 5,986,455 | A | * 11/1999 | Magnuson | .................. 324/318 |
| 6,194,898 | B1 | * 2/2001 | Magnuson et al. | ......... 324/300 |

(Continued)

FOREIGN PATENT DOCUMENTS

WO   03/040761 A1   5/2003

(Continued)

OTHER PUBLICATIONS

Gaudreau et al, Solid-State High Voltage, DC Power Distribution and Control, 1999, Proceedings of the 1999 Particle Accelerator Conference, IEEE, 568-570.*

(Continued)

*Primary Examiner*—Robert J. Pascal
*Assistant Examiner*—Krista M Flanagan
(74) *Attorney, Agent, or Firm*—Eugene Hyun, Esq.; Armstrong Teasdale LLP (57) ABSTRACT

A radio frequency power amplifier including control electronics for providing control signals for timing of the power amplifier. A first group of the drivers are coupled to the control electronics and a second group of drivers are coupled to the control electronics. The first group of drivers operate in response to the control signals to generate first drive signals and the second group of drivers operate in response to the control signals to generate second drive signals with a phase difference of 180° relative to the first drive signals. A first group of switches energize a first group of primary windings in response to the first drive signals and a second group of switches energize a second group of primary windings in response to the second drive signals. An output summing transformer has a plurality of ferrite cores, the first group of primary windings and the second group of primary windings passing through the ferrite cores. A secondary output winding for connection with a load passes through the ferrite cores of the output summing transformer.

15 Claims, 5 Drawing Sheets

U.S. PATENT DOCUMENTS

| | | | |
|---|---|---|---|
| 6,291,994 B1* | 9/2001 | Kim et al. | 324/300 |
| 6,294,955 B1* | 9/2001 | Luu et al. | 330/51 |
| 6,586,999 B2* | 7/2003 | Richley | 330/276 |
| 6,667,585 B2* | 12/2003 | O'Meara | 315/291 |
| 6,738,275 B1* | 5/2004 | Beland | 363/71 |
| 6,967,559 B2* | 11/2005 | Beland | 336/219 |
| 7,109,714 B2* | 9/2006 | Rudakov et al. | 324/322 |
| 2006/0012366 A1* | 1/2006 | Feldman et al. | 324/310 |
| 2006/0187691 A1* | 8/2006 | Beland | 363/71 |

FOREIGN PATENT DOCUMENTS

WO    03/049145 A2    6/2003

OTHER PUBLICATIONS

Irie and Takano, Very Low Output -Impedance RF System for a Proton Synchtron with Low Drive Power Requirements, Oct. 1999, IEEE Transcactions on Nuclear Science, vol. 46, No. 5, 1289-1293.*

Allen N. Garroway, et al., "Remote Sensing by Nuclear Quadrupole Resonance", IEEE Transactions on Geoscience and Remote Sensing, vol. 39, No. 6, Jun. 2001, pp. 1108-1118.

Joel B. Miller and Geoffrey A. Barrall, "Explosives Detection with Nuclear Quadrupole Resonance", American Scientist, vol. 93, Jan.-Feb. 2005, pp. 50-57.

International Search Report dated Dec. 22, 2006; Application No. PCT/US2006/031504 (5 pages).

* cited by examiner

POWER AMPLIFIER

This invention was made with Government support under Government Contract Nos. N41756-02-C-4692 and DAAB15-02-C-0032. The Government may have certain rights in this invention.

BACKGROUND OF THE INVENTION

The present invention relates to power amplifiers, such as, but not limited to, those used in an apparatus for the identification of different materials by the use of nuclear quadruple resonance (NQR). NQR technology uses radio frequency power amplifiers operating between 0.3 MHz and 5 MHz to produce a magnetic field for excitation of the material under investigation.

The nuclear quadruple resonance detection is a technique able to identify different materials uniquely. This technology is useful for (but not limited to) explosives detection. It is based on the physical property that some nuclei with a spin of ½ or more possess an electric quadruple moment. The interaction of this quadruple moment with the residual electric field gradient of the crystalline structure results in energy states separated by energies accessible to excitation by radio frequency magnetic fields in the range 0.3-5 MHz. The amplitude of the induced echo signals is very small and depends within some limits upon the excitation magnetic field. This is the reason why practical NQR detection systems use a coil with high quality factor (Q) connected to the output of the radio frequency power amplifier for generation of the magnetic field.

Typically class A-B radio frequency power amplifiers are used for driving NQR coils at power levels up to 0.5-2 kW. Increasing the output power above these levels is desirable to increase the signal to noise ratio (SNR) of the NQR system, but leads to large and heavy power systems that cannot be used in the compact portable systems desired for convenient explosives detection. Class D amplifiers allow a significant increase of the amplifier power output while decreasing the overall physical size and weight. The modern power MOSFET transistor, with very small $R_{on}$ on the order of 10 mΩ, allows a significant reduction of the energy losses in the transistor when used in a switching mode. The class D power amplifier applied to NQR technology allows the increase of output peak power to the region of tens of kilowatts.

A variety of different schematics for class D amplifiers are presented in periodical publications and patents. Usually, the class D amplifier is devised using the output transistors in a push-pull or H-bridge scheme. Typically, these power amplifier units employ MOSFET transistors coupled in parallel to achieve output power in the multi-kilowatt range. The output stages of such a power amplifier can also be coupled in series through the use of summing output-transformers. Separate transformers for every switching stage all have a common secondary winding to provide a serial connection through all of the distinct switching stages to yield a voltage summing output.

An additional requirement of pulsed high-Q NQR systems is rapid damping of the energy from the antenna to provide the optimum conditions for registration of the echo signals in the data acquisition intervals between transmitted pulses. This operation is typically provided by separate Q-damper devices coupled to the load.

BRIEF DESCRIPTION OF THE INVENTION

Embodiments of the invention include a radio frequency power amplifier comprising: a control electronics providing control signals for timing of the power amplifier; a first group of the drivers coupled to the control electronics and a second group of drivers coupled to the control electronics, the first group of drivers operating in response to the control signals to generate first drive signals, the second group of drivers operating in response to the control signals to generate second drive signals with a phase difference of 180° relative to the first drive signals; a first group of switches energizing a first group of primary windings in response to the first drive signals, a second group of switches energizing a second group of primary windings in response to the second drive signals; an output summing transformer having a plurality of ferrite cores, the first group of primary windings and the second group of primary windings passing through the ferrite cores; a secondary output winding for connection with a load, the secondary output winding passing through the ferrite cores of the output summing transformer.

Embodiments of the invention include an output summing transformer comprising: ferrite cores, where a number of ferrite cores is equal to a number of the stages of a power amplifier; a first group of primary windings passing through the ferrite cores and a second group of primary windings passing through the ferrite cores; a secondary output winding passing through the ferrite cores for connection with a load; a secondary damping winding passing through the ferrite cores, a number of Q-damper transistors coupled to the secondary damping winding for reducing the Q of the load after transmit pulses.

These and other features of the present invention will be understood by reading the following description along with the drawings.

DETAILED DESCRIPTION OF THE INVENTION

Figure 1:
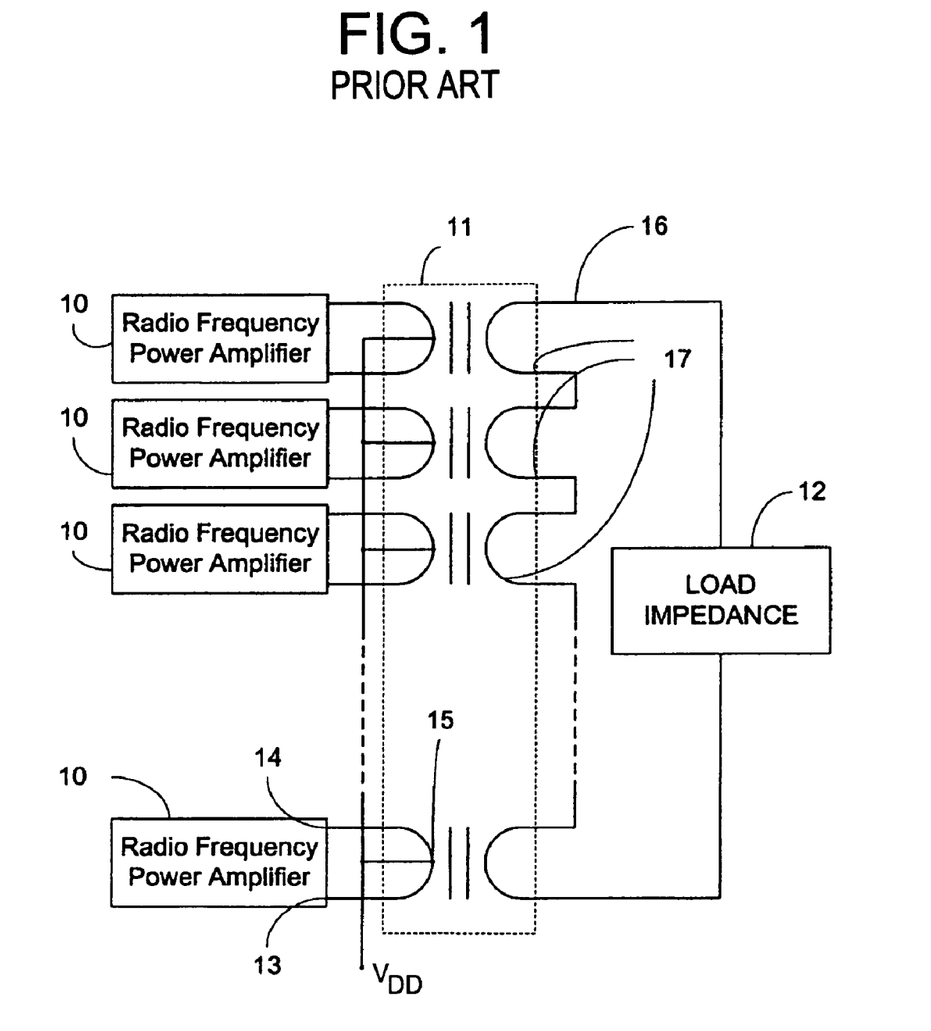
FIG. 1 is a block diagram of the components of a multi stage amplifier acting in a linear and switching mode with a summing output transformer according to the prior art.

FIG. 1 presents a scheme of the prior art power amplifier operating in class D mode. Some stages 10 of the power amplifier are coupled in parallel with a summing transformer 11. Every stage 10 has one or more transistors turned on in parallel by the control electronics (not shown) with phase 0°, and connected with the output terminal 14 of the primary winding. This single transistor, or group of transistors, provides output power during the first half of the period of the generated frequency. Every stage 10 has a second group of one or more transistors turned on in parallel by the control electronics with phase 180° and connected with the output terminal 13 of the primary winding. This transistor, or group of transistors, provides output power during the second half of the period of the generated frequency. Power supply voltage $V_{DD}$ is connected with the drains or collectors of all the transistor groups in the middle point 15 of every primary winding of the summing output transformer 11. The output-summing transformer contains the number of primary stages equal to the number of amplifier output stages. Every primary winding of the output-summing transformer is connected to each amplifier stage by the terminals 13 and 14 and to the power supply by terminal 15.

The output secondary winding 16 of the summing transformer 11 contains the secondary windings 17 of every stage transformer connecting serially. The output winding 16 is connected to the load 12.

The number of turns of the primary and secondary winding of each stage transformer 11 can be different to match the power amplifier to the load impedance. The main disadvantage of this schematic is the limitation of the output current and hence output power by the inductance of the primary windings of the stage transformers, whereas the low $R_{on}$ of the switching transistors allows the realization of the very low output impedance of the power amplifier.

Figure 2:
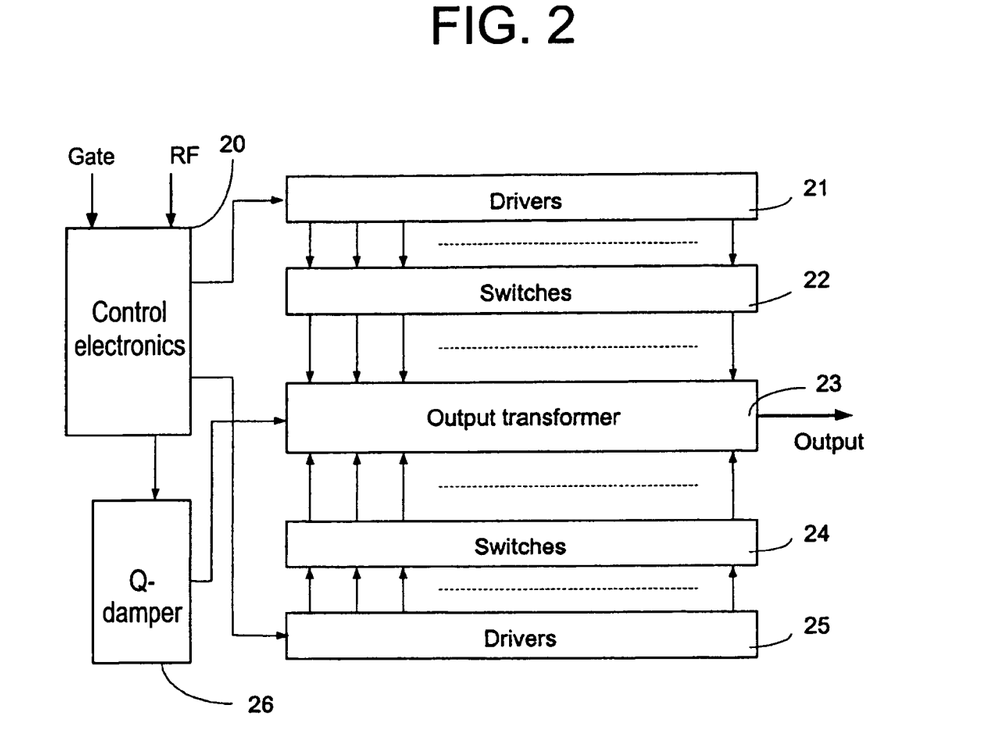
FIG. 2 is a block diagram of the class D power amplifier according to embodiments of the invention.

FIG. 2 shows the block schematic of a power amplifier according to embodiments of the invention. The control electronics 20 provides the necessary timing for the drivers 21 and 25, switching transistor groups 22 and 24, and Q-damper 26. To provide normal operation of the power amplifier, the control block 20 receives two external signals: the gate signal and RF signal. Control electronics 20 shapes two series of signals from the RF signal. One series of signals has a phase of 0° relative to the incoming RF signal, and the second series of signals one has a phase of 180° relative to the incoming RF signal. The duration of both series of RF signals is defined by the duration of the gate signal. The RF series with 0° phase go to the inputs of the drivers 21. Drivers 21 generate drive signals for switching groups 22 to shape the first half period of the amplifier output. The RF series with 180° phase go to the drivers 24. Drivers 25 generate drive signals for switching groups 24 and shape the second half period of the amplifier output. Switching groups 22 and 24 are connected with primary windings of each stage of the summing transformer 23. The output RF signal arises on the output secondary winding of the summing transformer 23.

The control electronics 20 turns the Q-damper on 0.5 μsec after the transmit pulse, and turns the Q-damper off 0.5 μsec after the next transmit pulse.

Figure 3:
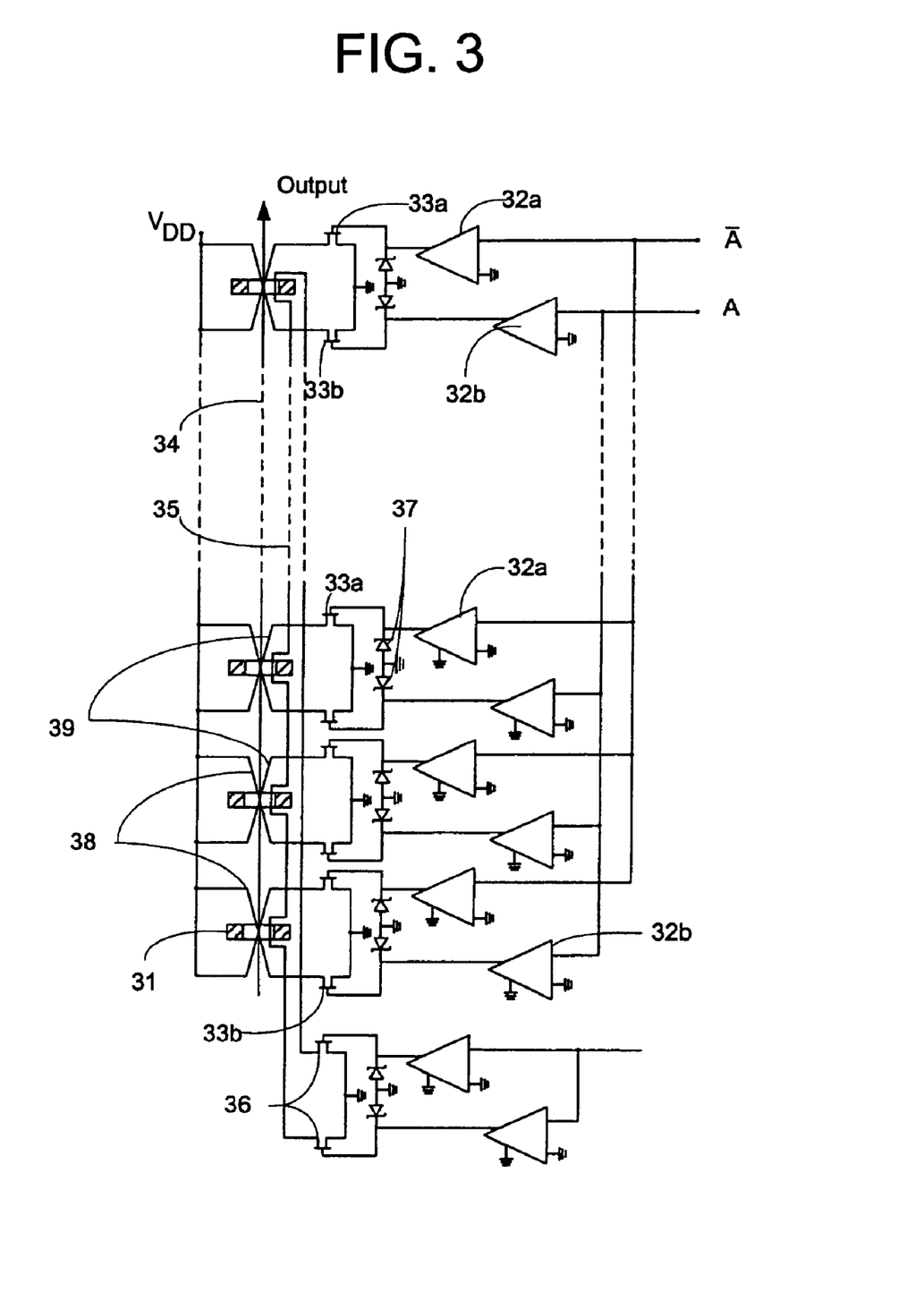
FIG. 3 shows a circuit diagram for the class D power amplifier with an integral Q-damper according to embodiments of the invention.

The detailed schematic of the power amplifier according to embodiments of the invention is shown in FIG. 3. The signals A and A-anti are produced by the control electronics and have the phase of 0° and 180°, respectively. The signal A starts the drivers 32b and switch transistors 33b and the signal A-anti starts drivers 32a and switch transistors 33a. The drains (or collectors) of the transistors 33b are connected with one of the primary windings 38 of the stage transformers 31. The other terminal of the primary winding 38 is connected to $V_{DD}$. This group of transistors is responsible for shaping of the first half period of the amplifier output. The drains (or collectors) of the transistors 33a are connected with one terminal of the primary windings 39 of the stage transformers 31. The other terminal of the winding 39 is connected to $V_{DD}$. This group of the transistors is responsible for shaping of the second half period of the amplifier output.

As seen from FIG. 3, the windings 38 and 39 pass through the stage transformers 31 in anti-phase with each other and look like the letter "X". Such a connection of the primary windings of the stage transformers excludes the disadvantage of the push-pull designs with the connection of the primary windings with $V_{DD}$ in the middle point. What is more, this X-bridge connection of the primary winding of the output transformer can be used not only in class D mode, but for other modes including A, B, C, E, F and S modes. For example, for class A and B modes this configuration allows an increase in output amplitude of almost two times for a given $V_{DD}$. The output impedance of the power amplifier in this case depends on $R_{on}$ of the switching transistors and the turns ratio of each stage transformer 31. The output impedance of the power amplifier $R_\Sigma$ can be estimated by the formula:

$$R_\Sigma = N * R_{on} * n^2$$

where N is the number of the power amplifier switching stages and n is the ratio of the number of output winding turns to the number of the primary winding turns of each stage transformer.

Secondary output winding 34 is the output terminal of the power amplifier and connects to the load.

Transistors 36 together with secondary damping winding 35 provide for the reduction of the Q of the amplifier load between transmit pulses. When they are turned on, secondary winding shunts the load and dissipates the main portion of the energy accumulated by the high Q load during the transmit pulse.

The transient voltage suppressors 37 are connected to the gate of every transistor to protect the drivers from the reverse voltage from the amplifier load. This protection of the driver outputs is mandatory, especially for transistors 38 of Q-damper, which are high voltage transistors with relatively high $R_{on}$.

Figure 4:
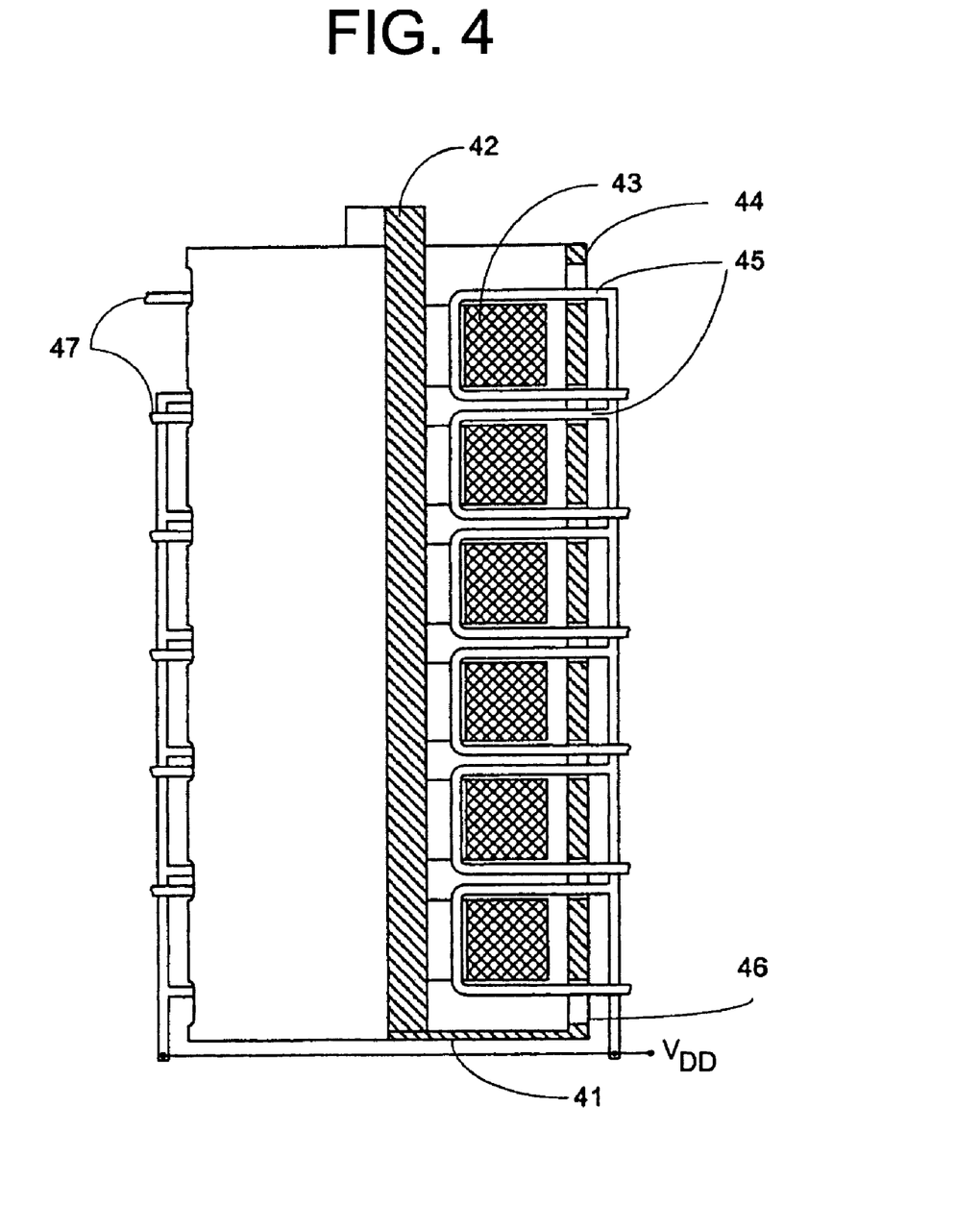
FIG. 4 presents a coaxial design of the summing output transformer according embodiments of the invention.

FIG. 4 presents a partial cross-sectional view of the coaxial design of the output-summing transformer. The design contains an outer 44 and inner 42 cylindrical electrode connected between each other by the end plate 41. The ferrite cores 43 of the transformers are placed into the cylindrical electrode 44 and electrode 42 passes through all ferrite cores. The ferrite cores 43 are toroids in the embodiment shown in FIG. 4. The free end of the electrode 42 is the output terminal of the power amplifier. The output ground terminal of the summing transformer is the free end of electrode 44. The primary windings of each stage transformer pass through the center of the ferrite cores and are connected with drains (or collectors) of the transistors and $V_{DD}$ by passing through the windows 46 in the cylindrical outer electrode 44. One parallel group of transistors is connected with windings 45 and the other anti-parallel group with windings 47. The parallel group of the transistors connecting with the group of primary windings 45 provides the first half period of the amplifier output, and the anti-parallel group of transistors connecting with the group of primary windings 47 provides second half period of the amplifier output.

Connecting the primary windings in the manner described above excludes the disadvantages of the prior art (FIG. 1) push-pull design with the connection of the middle point of the primary windings to the power supply voltage, and increases the efficiency of the power amplifier significantly.

The secondary winding of the output-summing transformer connects with the load through crossed diodes (not shown) to exclude the connection of the power amplifier output to the coil during the acquisition time when the echo signals are recorded by receiving apparatus.

The configuration shown in FIG. 4 is an exemplary view of the output-summing transformer. The details of the design can be realized in different ways. For example, the outer cylindrical electrode can be made from two half cylinders to simplify the assembly of the transformer. These parts of the outer electrode will be electrically connected to each other after the mechanical assembly of the transformer is complete.

FIG. 4 shows the output-summing transformer with a turn's ratio of 1:1. With the assembly method described above this ratio can differ from 1:1 to match the load impedance. Such a coaxial design allows for significant reduction of the parasitical parameters of the output-summing transformer.

Figure 5:
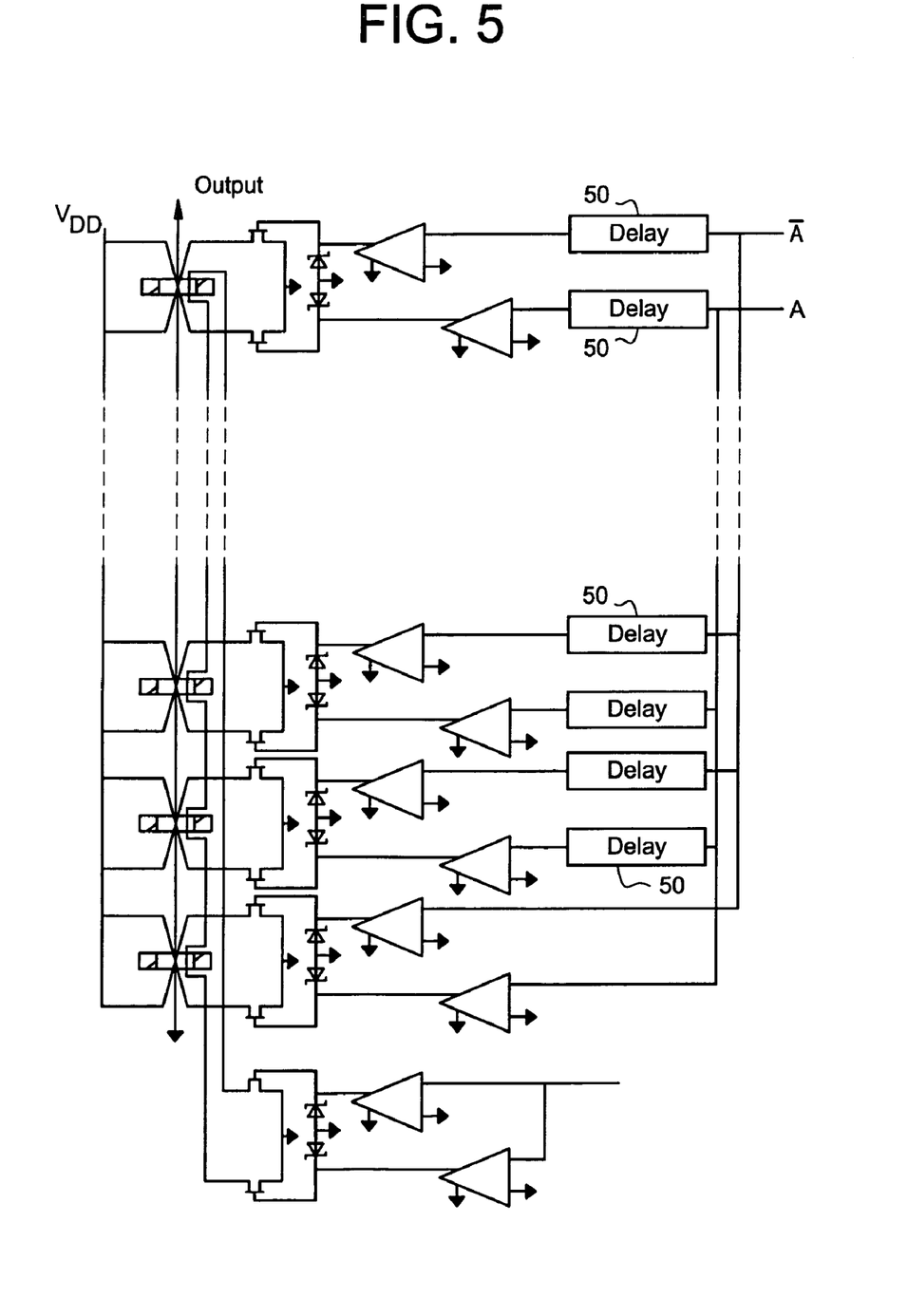
FIG. 5 shows the circuit diagram for the class D power amplifier with delays for compensation of the propagation time of the output signals in the summing output transformer.

The coaxial output transformer design is a transmission line, where the velocity of the signal depends on the permeability of the ferrites used in the stage transformers. The propagation time of the signal along the transformer becomes noticeable when ferrites with high permeability are used, and this leads to reduced efficiency of the amplifier at high frequencies. FIG. 5 shows the circuit scheme of the amplifier with compensation of the signal propagation time provided by the different stage delay pairs 50. The last stage of the amplifier, the most distant from the output of the summing transformer, has a delay equal to 0 for the driver pairs that energize the transistors of this stage. The stage nearest to the output of the transformer has the maximum delay set equal to the propagation time of the signal in the summing transformer. The delay pairs for the other stages are increased linearly from 0 to the maximum.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A radio frequency power amplifier comprising:
   a control electronics providing control signals for timing of the power amplifier;
   a first group of drivers coupled to the control electronics and a second group of drivers coupled to the control electronics, the first group of drivers operating in response to the control signals to generate first drive signals, the second group of drivers operating in response to the control signals to generate second drive signals with a phase difference of 180° relative to the first drive signals;
   a first group of switches energizing a first group of primary windings in response to the first drive signals;
   a second group of switches energizing a second group of primary windings in response to the second drive signals;
   an output-summing transformer having a plurality of ferrite cores, one primary winding of the first group of primary windings and one primary winding of the second group of primary windings passing through each of the plurality of ferrite cores, the first group of primary windings passing through the plurality of ferrite cores in a first direction and the second group of primary windings passing through the plurality of ferrite cores in a second direction opposite the first direction; and
   a secondary output winding for connection with a load, the secondary output winding passing through the plurality of ferrite cores of the output-summing transformer.

2. The power amplifier of claim 1 further comprising:
   a number of Q-damper transistors coupled to a secondary damping winding, the secondary damping winding passing through the ferrite cores for reducing the Q of the amplifier load between transmit pulses.

3. The power amplifier of claim 2 wherein the power amplifier operates in A, B, C, D, E, F and S modes.

4. The power amplifier of claim 1 wherein the first group of switches further comprises first transistors having a first terminal coupled to the first primary winding and a second terminal coupled to ground and the second group of switches further comprises second transistors having a first terminal coupled to the second primary winding and a second terminal coupled to ground.

5. The power amplifier of claim 4 wherein the first primary winding is coupled to a power supply and the second primary winding is coupled to the power supply.

6. The power amplifier of claim 4 wherein the first transistors have a gate terminal coupled to first transient voltage suppressors and the second transistors have a gate terminal coupled to second transient voltage suppressors.

7. The power amplifier of claim 1 wherein the signals from the different stages are delayed to compensate the propagation time of the signals in the output summing transformer.

8. The power amplifier of claim 1 wherein the ferrite cores are toroids, the first group of primary windings and the second group of primary windings passing through the toroid center in opposite directions.

9. An output summing transformer comprising:
   ferrite cores, where a number of ferrite cores is equal to a number of the stages of a power amplifier;
   a first group of primary windings passing through the ferrite cores and a second group of primary windings passing through the ferrite cores;
   a secondary output winding passing through the ferrite cores for connection with a load;
   a secondary damping winding passing through the ferrite cores; and
   a number of Q-damper transistors coupled to the secondary damping winding for reducing the Q of the amplifier load between transmit pulses.

10. The output summing transformer of claim 9 wherein the first group of primary windings pass through the ferrite cores in a first direction and the second group of primary windings pass through the ferrite cores in a second direction opposite the first direction.

11. The output summing transformer of claim 9 wherein the ferrite cores are toroids, the first group of primary windings and the second group of primary windings passing through the toroid center in opposite directions.

12. The output summing transformer of claim 9 wherein windings in the first group of primary windings have a first terminal for connection to a power supply and a second terminal for connection to a first switch, windings in the second group of primary windings have a first terminal for connection to a power supply and a second terminal for connection to a second switch.

13. The output summing transformer of claim 9 wherein the secondary output winding has a shape of a coaxial cable, the secondary output winding including an outer cylindrical electrode connected by an end plate with a central electrode.

14. The output summing transformer of claim 13 wherein the central electrode passes through the ferrite cores.

15. The output summing transformer of claim 14 wherein connection to the load is made with the central electrode at an open end opposite the end plate.

* * * * *